United States Patent [19]

Bupp et al.

[11] Patent Number: 4,478,883
[45] Date of Patent: Oct. 23, 1984

[54] CONDITIONING OF A SUBSTRATE FOR ELECTROLESS DIRECT BOND PLATING IN HOLES AND ON SURFACES OF A SUBSTRATE

[75] Inventors: James R. Bupp; Voya Markovich, both of Endwell; Tracy E. Napp, Vestal; Carlos J. Sambucetti, Croton-on-Hudson, all of N.Y.

[73] Assignee: International Business Machines Corporation, Armonk, N.Y.

[21] Appl. No.: 398,140

[22] Filed: Jul. 14, 1982

[51] Int. Cl.$^3$ .............................................. C23C 3/02
[52] U.S. Cl. ..................................... 427/97; 427/304; 427/305; 427/306
[58] Field of Search .......................... 427/304, 306, 97

[56] References Cited

U.S. PATENT DOCUMENTS

| | | | |
|---|---|---|---|
| 2,996,403 | 8/1961 | Lukes . | |
| 3,011,920 | 12/1961 | Shipley . | |
| 3,372,059 | 3/1968 | Roth | 427/304 |
| 3,421,922 | 1/1969 | Wilson | 427/306 |
| 3,515,649 | 6/1970 | Hepfer . | |
| 3,563,784 | 2/1971 | Innes . | |
| 3,573,973 | 4/1971 | Drotar . | |
| 3,684,572 | 8/1972 | Taylor . | |
| 3,844,799 | 10/1974 | Underkofler . | |
| 3,877,981 | 4/1973 | Arnold | 427/305 |
| 3,930,072 | 12/1975 | Wilks | 427/306 |
| 4,066,809 | 1/1978 | Alpaugh | 427/304 |
| 4,152,467 | 5/1979 | Alpaugh | 427/8 |
| 4,244,789 | 1/1981 | Coll-Palagos | 427/306 |
| 4,301,190 | 11/1981 | Feldstein | 427/306 |

Primary Examiner—John D. Smith
Attorney, Agent, or Firm—Pollock, Vande Sande & Priddy

[57] ABSTRACT

A dielectric surface is conditioned for electroless plating of a conductive metal thereon by contacting the surface with a multifunctional ionic copolymer. The conditioning can be in the holes and/or on the surfaces of the substrate.

27 Claims, No Drawings

CONDITIONING OF A SUBSTRATE FOR ELECTROLESS DIRECT BOND PLATING IN HOLES AND ON SURFACES OF A SUBSTRATE

DESCRIPTION

1. Technical Field

The present invention is concerned with conditioning a dielectric material and is particularly concerned with treating a dielectric substrate to prepare the substrate for the electroless deposition of a conductive metal thereon. This conditioning can be in the holes and/or on the surfaces of the substrate. The present invention finds particular applicability for the manufacture of printed circuit cards and boards.

2. Background Art

In the manufacture of printed circuit cards and boards a dielectric sheet material is employed as the substrate. A conductive circuit pattern is provided on one or both of the major surfaces of the substrate.

A conductive pattern can be formed on the surface of the substrate using a variety of known techniques. These known techniques include the substractive technique where a layer of copper is etched to form the desired circuit pattern, the EDB (electroless direct bond) technique where copper is electrolessly plated directly on the surface of the substrate in the desired pattern, the peel-apart technique where the desired circuit pattern is plated up from a thin layer of peel-apart copper, etc. In any of these techniques, connections between layers are made by means of plated through holes. In plating such holes, copper must be plated directly on the dielectric substrate (on the walls of the holes). Furthermore, if one uses the EDB technique, one must plate directly on the surface of the substrate.

Since the dielectric substrate is nonconductive, in order to plate on the substrate (either on the walls of the holes or on the surface of the substrate) the substance must be seeded or catalyzed prior to the deposition of metal onto the substrate.

Among the more widely employed procedures for catalyzing a substrate is the use of a stannous chloride sensitizing solution and a palladium chloride activator to form a layer of metallic palladium particles. For instance, one method for catalyzing a dielectric substrate is exemplified by U.S. Pat. No. 3,011,920 which includes sensitizing the substrate by first treating it with a solution of a colloidal metal, accelerating the treatment with a selective solvent to remove protective colloids for the sensitized dielectric substrate and then electrolessly depositing a metal coating on the sensitized substrate; for example, with copper from a solution of a copper salt and a reducing agent. Also, as suggested, for example, in U.S. Pat. No. 3,009,608, a dielectric substrate can be pretreated by depositing a thin film of a "conductivator" type of metal particle such as palladium metal from a semicolloidal solution onto the dielectric substrate to provide a conducting base which permits electroplating with conductive metal on the conductivated base. Moreover, U.S. Pat. No. 3,632,388 suggests a method for treating a polymeric plastic substrate in a plating process which utilizes a preliminary chromic acid etch followed by a one step activation in a tin-palladium hydrosol.

The foregoing discussed methods have been satisfactory for electroless or electroplating thin layers of conductive materials on nonconductive dielectric substrates for many prior art applications. More recently, U.S. Pat. No. 4,066,809 discloses the use of a so-called "triple seeding" technique. This technique preferred in U.S. Pat. No. 4,066,809 includes contacting the surfaces of the dielectric material with an aqueous stannous chloride sensitizing solution followed by contacting the surfaces of the dielectric material with an aqueous palladium chloride activator solution, and then followed by contacting the surfaces of the dielectric material with an aqueous palladium chloride/stannous chloride/hydrochloric acid seeder bath.

There have also been suggestions in the patent literature of treating substrates with certain surfactants. In particular, U.S. Pat. No. 4,301,190 suggests a pre-wet treatment of a substrate with an "absorption modifier" to enhance the attachment to the substrate of a non-noble metal catalyst. Certain surfactants, hydrous oxide sols and certain complexing agents are suggested as "absorption modifiers". U.S. Pat. No. 3,563,784 to Innes et al suggests a method of pretreating nonconductors for plating including a step of treating the surface with certain monofunctional surfactants, rinsing, and then activating either by a "two-step stannous chloride-palladium chloride treatment or the one-step acid, tin-palladium hydrosol treatment."

U.S. Pat. No. 3,684,572 to Taylor relates to a method of plating nonconductors including steps of treating the surface of the nonconductors with certain quaternary amine monofunctional or single charged surfactants after etching and before catalyzing the surface.

U.S. Pat. No. 3,573,937 to Drotar et al. relates to a process for plating a nonconductive substrate. Reference is made therein to a step of rinsing the substrate with certain detergents before sensitizing with stannous chloride and activating with palladium chloride.

U.S. Pat. Nos. 3,515,649 to Hepfer; 3,877,981 to Arnold; and 3,930,072 to Wilks are of interest in showing the use of surfactants in plating processes in steps other than before deposition of a catalyst.

U.S. Pat. No. 4,008,343 to Cohen et al. suggests a process for electroless deposition wherein the catalytically prepared surface is rinsed with an aqueous acid solution with a pH of less than 1.5. The acid used is hydrochloric acid, perchloric acit, or nitric acid.

DISCLOSURE OF INVENTION

The present invention provides for increased efficiency of the seeding or activation of a dielectric material for subsequent electroless plating. This, in turn, results in improved and more reliable electroless plating of conductive metals. The improved plating is achieved in the plated through holes as well as on the major surfaces of the dielectric substrates.

For instance, during seeding for subsequent plating of a dielectric substrate, there may already be present a conductive metal, such as copper, on certain surfaces. The already present metal tends to attract the seeder, such as palladium catalyst, resulting in lesser amounts of catalyst on the dielectric substrate where it is most needed. This is particularly noticeable when plating the through holes wherein copper may be present in internal planes of the substrate. With the present invention the plating in the through holes is generally uniform notwithstanding the presence of the edges of the copper interplanes.

In addition, the present invention makes it possible to achieve excellent plating, both in the holes and if an EDB process is being used on the major surfaces with the use of only a single seeder step.

In particular, the present invention is directed to a method for conditioning at least one surface of a dielectric substrate material for the electroless plating of a conductive metal thereon. The method of the present invention includes contacting at least one surface of the dielectric substrate with a composition containing a multifunctional ionic copolymeric material containing at least two available ionic moieties. The surface coated with the ionic polymeric material is then activated by being contacted with a composition containing a catalyst to directly or as a precursor leading to catalytic sites capable of electroless plating initiation of a conductive metal thereon. The surface coated can be in the holes and/or the major surfaces of the substrates.

The ionic characteristic of the polymeric material is opposite the ionic charge associated with the catalyst particles. For example, when the ionic charge associated with the catalyst is anionic (i.e.-negative) the polymeric material is cationic.

BEST AND VARIOUS MODES FOR CARRYING OUT INVENTION

The process of the present invention is applicable to treating or conditioning a wide variety of dielectric (non-conductor) substrates. Dielectric substrates descibed in the prior art, including thermoplastic and thermosetting resins, and glass, may be treated in accordance with the present invention.

Typical thermosetting polymeric materials include epoxy, phenolic based materials, and polyamides. The dielectric materials may be molded articles of the polymers containing fillers and/or reinforcing agents such as glass filled epoxy or phenolic based materials. Examples of some phenolic type materials include copolymers of phenol, resorcinol, and cresol. Examples of some suitable thermoplastic polymeric materials include polyolefins such as polypropylene, polysulfones, polycarbonates, nitrile rubbers and ABS polymers.

The term "surface", as employed herein, refers to the surfaces inside through holes as well as the major surfaces of the substrate. For instance, the present invention is useful for seeding the plated through holes where the circuitry is being applied by either additively plating upon a thin layer of peel-a-part copper or by a subtractive process. Also, the present invention is useful for seeding in a solution where an electroless direct bond (EDB) is being used. In this case, the circuitry is additively plated both in the holes and over the entire surface of the board as desired.

Prior to the initiation of the process of the present invention for treating the dielectric substrate, the required through holes in the circuit board are made and the dielectric with the through holes is suitably cleaned and preconditioned.

For instance, the preconditioning can include creation of active sites by physical means such as sand and/or vapor blasting and/or chemical methods such as solvent swelling. A typical solvent is N-methyl pyrrolidone. The substrate can also be pretreated with a sulfochromic acid composition.

In accordance with the present invention, the substrate is treated with an aqueous solution containing a multifunctional ionic polymer. The polymer is a multifunctional ionic material in that it must contain at least two active or available ionic functional moieties of the same polarity. The polymers are at least water miscible and are preferably water soluble or at least soluble in the water compositions employed in the present invention. The preferred ionic moieties are cationic moieties such as quaternary phosphonium and quaternary ammonium groups. Polymers containing at least two ionic moieties are commercially available and need not be described herein in any great detail. Examples of commercially available multifunctional cationic polymers are Reten 210, Reten 220, and Reten 300, available from Hercules, description of which can be found in "Water-Soluble Polymers", Bulletin VC-482A, Hercules Incorporated, Wilmington, Del. 19899, disclosure of which is incorporated herein by reference.

Reten 210 is in powder form and is a copolymer of acrylamide and betamethacryloxyethyltrimethylammonium methyl sulfate having a Brookfield viscosity of a 1% solution of 600–1000 cps.

Reten 200 is in powder form and is a copolymer of acrylamide and betamethacryloxyethyltrimethylammonium methyl sulfate having a Brookfield viscosity of a 1% solution of 800–1200 cps.

Reten 300 is a liquid and is a homopolymer of betamethacryloxyethyltrimethylammonium methyl sulfate having a Brookfield viscosity of a 1% solution of 300–700 cps.

The molecular weight of the Reten polymers are usually relatively high and vary from about 50,000 to about one million or more. These high molecular weight polymers are solid products and their main chemical backbone structure is polyacrylamide. The cationic Reten (positive charge) is obtained by attaching to the polyacrylamide various tetraalkyl ammonium compounds. These quaternary ammonium groups provide the number of positive charges of the polymer.

In addition, as discussed hereinabove, the present invention is concerned with the use of various different types of water soluble polyelectrolytes or polymers which can vary in molecular weight and charge functionality. For instance, an anionic (negative charge) polymer can be used to enhance the adhesion of positive charge colloids to a dielectric surface. In this case, the polymer can also have a backbone structure of polyacrylamide and have as the attached active charge groups, carboxylic acid groups.

In the preferred aspects of the present invention, the ionic polymer is employed as a dilute aqueous solution of about 0.01 to about 1% by weight and preferably about 0.05 to about 0.5% by weight of the copolymer. The aqueous solution also usually contains an inorganic acid such as HCl to provide a pH of about 1 to about 7 and, preferably a pH of about 2 to about 3. The use of a pH of about 2 to about 3 is preferred in order to obtain a relatively low viscosity for the polymer solution to facilitate application of the polymer. The viscosity drastically increases when the pH is above about 4 to 5. The acid is usually present in amounts of about 2 to about 10% by weight.

The treatment with the ionic polymer is generally about 1 to about 10 minutes and preferably about 1 to about 2 minutes.

The multifunctional polymer provides a surface being of a polarity opposite from that associated with the catalyst particles to be subsequently applied to the substrate. This difference in polarity provides for electrostatic attraction of the catalyst particles.

After the substrate is contacted with the ionic polymer composition, the substrate is rinsed to remove any excess polymer not adsorbed by the substrate.

Next, the substrate is activated by contact with a composition containing a catalytic composition capable of initiating the electroless plating process. The compounds contain a metal which can directly provide the catalytic sites or serves as a precursor which leads to the catalytic sites. The metal present may be in the elemental form, an alloy, or compound, or mixtures thereof. The preferred metal catalysts are precious metals such as gold, palladium, and platinum. In addition, in view of the improved conditioning of the substrate achieved according to the present invention, the catalyst can be a non-precious metal such as copper, nickel, cobalt, iron, zinc, manganese, and aluminum.

The most preferred catalyst is palladium. A typical palladium composition contains about 1.2–2.5 grams/liter of a palladium salt which is preferably $PdCl_2$, about 80–150 grams/liter of a stannous salt which is preferably $SnCl_2.2H_2O$, and about 100–150 milliliters per liter of an acid which is preferably HCl. When HCl is provided in the form of a 37% HCl solution, about 290 to 360 milliliters of the HCl solution is preferably employed. The most preferred composition contains about 1.5 grams per liter of $PdCl_2$, about $\phi$grams per liter of $SnCl_2$, and about 280 milliliters per liter of 37% HCl. The composition is usually maintained at a temperature of 65°±10° F. It is believed that the palladium particles in the solution have associated therewith a negative charge as the pendant charge extending outward therefrom. In particular, it is believed that the following occurs in the palladium chloride solution:

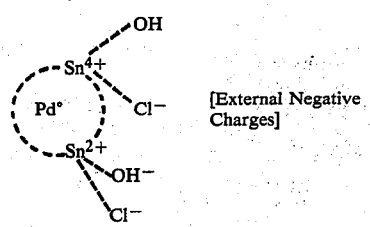

[External Negative Charges]

Accordingly, with a palladium-stannous catalyst system, the ionic polymer is a cationic polymer (positively charged).

A typical triple seeder process includes first contacting the dielectric substrate surfaces and/or the through holes with a stannous chloride sensitizing solution ($SnCl_2/HCl$). Typically, the contacting time is from 4 to 10 minutes with a preferred contact time of 7 minutes. Contacting the dielectric surface with this solution conditions the surfaces including the through holes be depositing thereon a layer of tin ($Sn^{+2}$). The stannous chloride is then rinsed from the substrate and/or through holes with water. A hot water rinse being in a temperature range from 55° C. to about 80° C. is preferred. The hot water removes any excess stannous chloride and also hydrolized the $SnCl_2$ on the surface to produce gelatinous tin hydrous oxides, which are absorbed on the surface of the board as a stannous complex.

The next seeding step includes contacting the dielectric substrate surfaces and/or the through hole surfaces with a palladium chloride activator in which divalent palladium interacts with the stannous compounds on the board surface to form an adherent layer of metallic palladium particles thereon. This may be accomplished by immersing the dielectric in the palladium activator bath for 2±1 minutes. This step promotes the adhesion of the final seeding step and increases the concentration of the final catalytic layer which is deposited in the final seeding step.

The third step of the seeding process includes contacting the substrate surface and/or through hole surfaces with a palladium chloride/stannous chloride/hydrochloric acid seeder bath. While a preferred contact time of 5 minutes is desired, it has been found that the actual contact time can vary from 1 to 10 minutes and still provide satisfactory results. This step deposits the final catalytic layer which permits the additive metal such as copper to be plated electrolessly on the surface and in the through holes of the dielectric substrate.

In preparing the solution for the first step of the process, it is found that the combination of stannous chloride having a content of between 53 and 57 grams per liter of $SnCl_2.2H_2O$ with 37% hydrochloric acid at a ratio of 50 milliliters per liter with the pH of the solution adjusted to a range between 0.2 and 0.5 provides a desired preconditioning solution. The $SnCl_2.2H_2O$ is dissolved in the HCl with the resulting mixture being added to a tank of deionized water. It is generally found that the optimum results are obtained when the pH is approximately 0.4 and the solution is maintained at a temperature of 65°±10° F.

For the second step of the triple seeder process, the palladium chloride bath is formed by mixing 50 grams of palladium (with a concentration of 0.13 to 0.17 grams per liter) with approximately 3780 milliliters of 37% hydrochloric acid (having a concentration of 10 milliliters per liter). The $PdCl_2$ is dissolved in the hydrochloric acid with the resultant mixture being added to a tank of deionized water. Again, the bath is maintained at a temperature of 65°±10° F., the pH is maintained between 0.75 and 1.00 and the copper content of the solution is kept below 50 parts per million.

The final catalytic palladium chloride/stannous chloride/hydrochloric acid seeder bath includes a bath comprising 1.2 to 2.5 grams per liter of $PdCl_2$ with 80 to 150 grams per liter of $SnCl_2.2H_2O$ together with between 290 and 360 milliliters of 37% HCl per liter of solution. This third seeding bath is again maintained at a temperature of 65°±10° F. The optimum solution of the bath includes about 1.5 grams per liter of $PdCl_2$, 100 grams per liter of $SnCl_2$ and 280 milliliters per liter of 37% hydrochloric acid.

Next, a metal such as nickel or copper, is plated by electroless plating onto the treated surface. The metal is coated to the desired thickness. The preferred metal employed is copper. The preferred copper electroless plating baths and their method of application are disclosed in U.S. Pat. Nos. 3,844,799 and 4,152,467, disclosures of which are incorporated herein by reference.

The copper electroless plating bath is generally an aqueous composition which includes a source of cupric ion, a reducing agent, a complexing agent for the cupric ion, and a pH adjuster. The plating baths also preferably include a cyanide ion source and a surface active agent.

The cupric ion source generally used is a cupric sulfate or a cupric salt of the complexing agent to be employed. When employing cupric sulfate, it is preferred to use amounts from about 3 to about 15 grams/liter and most preferably from about 8 to about 12 grams/liter. The most common reducing agent employed is formaldehyde which, in the preferred aspects of the present invention, is used in amounts from about 0.7 to about 7 grams per liter and most preferably from about 0.7 to about 2.2 grams per liter. Examples of some other reducing agents include formaldehyde precursors or derivatives such as paraformaldehyde, trioxane, dimethyl hydantoin, glyoxal; borohydrides such as alkali metal borohydrides (sodium and potassium borohydride) and substituted borohydrides such as sodium trimethoxyborohydride; boranes such as amineboran (isopropyl amine borane and morpholine borane). Hypophosphite reducing agents can also be used for electroless Ni and Cu plating within the scope of the present invention.

Examples of some suitable complexing agents include Rochelle salts, ethylene diamine tetraacetic acid, the sodium (mono-, di-, tri-, and tetra-sodium) salts of ethylene diamine tetraacetic acid, nitrilotetracetic acid and its alkali salts, gluconic acid, gluconates, triethanol amine, glucono-(gamma)-lactone, modified ethylene diamine acetates such as N-hydroxyethyl ethylene diamine triacetate. In addition, a number of other suitable cupric complexing agents are suggested in U.S. Pat. Nos. 2,996,408; 3,075,856; 3,075,855; and 2,938,805. The amount of complexing agent is dependent upon the amount of cupric ions present in the solution and is generally from about 20 to about 50 grams/liter, or in a 3-4 fold molar excess.

The plating bath can also contain a surfactant which assists in wetting the surface to be coated. A satisfactory surfactant is, for instance, an organic phosphate ester available under the trade designation Gafac RE-610. Generally, the surfactant is present in amounts from about 0.02 to about 0.3 grams/liter. In addition, the pH of the bath is also generally controlled, for instance, by the addition of a basic compound such as sodium hydroxide or potassium hydroxide in the desired amount to achieve the desired pH. The preferred pH of the electroless plating bath is between 11.6 and 11.8.

Also preferably, the plating bath also contains a cyanide ion and most preferably contains about 10 to about 25 miligrams per liter to provide a cyanide ion concentration in the bath within the range of 0.0002 to 0.0004 molar. Examples of some cyanides which can be employed according to the present invention are the alkali metal, alkaline earth metal, and ammonium cyanides. In addition, the plating baths can include other minor additives as is well known in the prior art.

The preferred plating baths employed have a specific gravity within the range of 1.060 to 1.080. In addition, the temperature of the bath is preferably maintained between 70° and 80° C. and most preferably between 70° and 75° C. For a discussion of the preferred plating temperatures coupled with the preferred cyanide ion concentrations, see U.S. Pat. No. 3,844,799.

Also, it is preferred to maintain the $O_2$ content of the bath between about 2 ppm and 4 ppm and preferably about 2.5 to 3.5 ppm as discussed in U.S. Pat. No. 4,152,467. The $O_2$ content can be controlled by injecting oxygen and an inert gas into the bath.

The overall flow rate of the gases into the bath is generally from about 1 to about 20 SCFM per 1000 gallons of bath and preferably from about 3 to about 8 SCFM per 1000 gallons of bath.

The following non-limiting examples are presented herein to further illustrate the present invention.

EXAMPLE 1

A glass substrate previously cleaned in alcohol is immersed into a bath of about 0.05 grams of Reten per 100 ml of an 8% HCl aqueous solution for about 3 minutes. The substrate is then rinsed with deionized water and dried with air. Next, the coated substrate is immersed in a bath of about 1.5 grams per liter of $PdCl_2$, about 100 grams per liter of $SnCl_2$, and about 280 milliliters per liter of 37% HCl at about 65° F. for about 3 minutes. The substrate is then air dried. The substrate has a very visible Pd catalytic film thereon. The substrate is then immersed in a copper electroless additive plating bath for about 10 minutes. The electroless plating bath contains about 10 grams per liter of $CuSO_4$-$5H_2O$, 35 grams per liter of ethylene diamine tetraacetic acid dihydrate, 0.25 grams per liter of GAFAC RE-610, 14 milligrams per liter sodium cyanide, and 2 milliliters per gram of 37% aqueous HCHO. The specific gravity of the plating bath is about 1.07, the pH is 11.7 by the addition of NaOH and the temperature of the bath is 73°±5° C. The $O_2$ content of the bath is maintained at about 2.5 to 3.5 ppm. The gas flow rate is about 12 SCFM. In addition, the plating racks are continuously agitated during the plating.

The substrate, after plating, has a continuous copper film thereon.

COMPARISON EXAMPLE 2

A glass substrate previously cleaned in alcohol is coated with a silica colloid to provide a negative charge on the surfaces thereof. The substrate is rinsed with deionized water and dried in air. Next, the coated glass is immersed in the same palladium chloride composition and under the same conditions as used in Example 1. However, no film formed on the glass substrate.

COMPARISON EXAMPLE 3

A glass substrate previously cleaned in alcohol is immersed in the same palladium chloride and under the same conditions as used in Example 1. However, no film forms on the glass substrate.

A comparison of Example 1 with Examples 2 and 3 clearly shows the enhanced film formation achieved by the present invention.

While the invention has been described in terms of the preferred embodiment thereof, it will be readily apparent to those skilled in the art that other modifications and variations may be made therein without departing from the scope or spirit of the invention. It is therefore intended that the invention not be limited to the specifics of the foregoing description of the preferred embodiment, but rather is to embrace the full scope of the following claims.

What is claimed is:

1. A method for conditioning at least one surface of a dielectric substrate material for the electroless plating of a conductive metal thereon, which comprises:
   contacting said at least one surface with a composition containing a multifunctional ionic polymer material containing at least two available ionic moieties, wherein said ionic moieties are of a charge opposite from the charge associated with the colloidal catalyst particles to be subsequently applied to the substrate to provide for electrostatic attraction of said colloidal catalyst particles, and then activating the surface by contacting it with a composition containing a colloidal catalyst to provide directly or as a precursor leading to catalytic sites capable of electroless plating initiation of a conductive metal thereon.

2. The method of claim 1 wherein said multifunctional ionic polymer material is a multifunctional cationic polymer material.

3. The method of claim 1 wherein said multifunctional ionic polymer material is a copolymer of acrylamide and ammonium quaternary compounds.

4. The method of claim 3 wherein said composition contains about 0.01 to about 1% by weight of said copolymeric material.

5. The method of claim 3 wherein said composition contains about 0.05 to about 0.5% by weight of said ionic copolymeric material.

6. The method of claim 3 wherein said composition also contains HCl.

7. The method of claim 3 wherein said HCl is present in an amount of about 2 to about 10% by weight.

8. The method of claim 1 wherein said contacting with said composition containing a multifunctional ionic polymer is for about 1 to about 10 minutes.

9. The method of claim 1 wherein said contacting with said multifunctional ionic polymer is about 1 to about 5 minutes.

10. The method of claim 1 wherein the surface is activated with a composition containing a palladium compound.

11. The method of claim 1 wherein said surface is activated with a composition containing palladium chloride.

12. The method of claim 11 wherein said palladium chloride composition contains about 1.2 to about 2.5 grams per liter of palladium chloride, about 80 to about 150 grams of stannous chloride, and about 100 to about 150 milliliters per liter of 37% HCl.

13. The method of claim 1 wherein the activating is with a composition containing about 1.5 grams per liter of $PdCl_2$, about 100 grams per liter of $SnCl_2$, and about 280 milliliters per liter of 35% aqueous HCl.

14. The method of claim 13 wherein the contacting is at a temperature of about 65°±10° F. for the activating.

15. The method of claim 1 which additionally includes contacting the activated surface with an electroless plating bath containing a conductive metal therein.

16. The method of claim 15 wherein said conductive metal is nickel or copper.

17. The method of claim 15 wherein said conductive metal is copper.

18. The method of claim 1 wherein said at least one surface includes through holes in a substrate.

19. The method of claim 1 wherein said at least one surface includes a major surface on a substrate.

20. The method of claim 3 wherein said composition has a pH of about 1–7.

21. The method of claim 7 wherein said composition has a pH of about 2–3.

22. The method of claim 1 wherein said contacting with said composition containing a multifunctional ionic polymer is for about 1 to about 2 minutes.

23. The method of claim 1 wherein said multifunctional ionic polymer material is a polyacrylamide backbone having attached thereto tetraalkyl ammonium compounds.

24. The method of claim 1 wherein said polymer material is a copolymer of acrylamide and hexamethacryloxyethyltrimethyl ammonium methyl sulfate.

25. The method of claim 1 wherein said polymer material provides for the electrostatic attraction of said catalyst particles to said dielectric substrate.

26. The method of claim 1 wherein said polymer material is water soluble.

27. The method of claim 1 wherein said ionic moieties are quaternary phosphonium groups or quaternary ammonium groups.

* * * * *

UNITED STATES PATENT AND TRADEMARK OFFICE
CERTIFICATE OF CORRECTION

PATENT NO. : 4,478,883
DATED : October 23, 1984
INVENTOR(S) : Bupp, et al.

It is certified that error appears in the above-identified patent and that said Letters Patent is hereby corrected as shown below:

Column 1, line 39, please delete "substance" and insert therefor --- substrate ---.

Column 1, line 55, please delete "3,009,608" and insert therefor --- 3,099,608 ---.

Column 4, line 18, please delete "200" and insert therefor --- 220 ---.

Column 5, line 23, please delete "∅grams" and insert therefor --- about 100 grams ---.

Column 5, line 34, please delete "OH" and insert therefor --- OH ---.

Column 5, line 52, please delete "be" and insert therefor --- by ---.

Signed and Sealed this

Sixteenth Day of April 1985

[SEAL]

Attest:

DONALD J. QUIGG

Attesting Officer   Acting Commissioner of Patents and Trademarks